(12) United States Patent
Cho et al.

(10) Patent No.: US 7,163,899 B1
(45) Date of Patent: Jan. 16, 2007

(54) LOCALIZED ENERGY PULSE RAPID THERMAL ANNEAL DIELECTRIC FILM DENSIFICATION METHOD

(75) Inventors: Seon-Mee Cho, San Jose, CA (US); George D. Papasouliotis, Sunnyvale, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 11/327,668

(22) Filed: Jan. 5, 2006

Related U.S. Application Data

(63) Continuation-in-part of application No. 10/975,028, filed on Oct. 26, 2004.

(51) Int. Cl.
*H01L 21/31* (2006.01)
*H01L 21/461* (2006.01)

(52) U.S. Cl. .................. 438/758; 438/788; 257/E21.16

(58) Field of Classification Search ................ 438/758, 438/778, 787, 788; 257/E21.16, E21.159; 427/255.28, 255.37, 255.29
See application file for complete search history.

(56) References Cited

U.S. PATENT DOCUMENTS

| | | | |
|---|---|---|---|
| 5,314,724 A | 5/1994 | Tsukune et al. | |
| 5,525,550 A | 6/1996 | Kato | |
| 5,527,561 A | 6/1996 | Dobson | |
| 5,597,395 A * | 1/1997 | Bocko et al. | 65/33.4 |
| 5,705,028 A | 1/1998 | Matsumoto | |
| 5,985,770 A | 11/1999 | Sandhu et al. | |
| 6,030,881 A | 2/2000 | Papasouliotis et al. | |
| 6,102,993 A | 8/2000 | Bhandari et al. | |
| 6,133,160 A | 10/2000 | Komiyama et al. | |
| 6,184,143 B1 | 2/2001 | Ohashi et al. | |
| 6,300,219 B1 | 10/2001 | Doan et al. | |
| 6,316,063 B1 | 11/2001 | Andideh et al. | |

(Continued)

FOREIGN PATENT DOCUMENTS

JP 5-308071 A 11/1993

(Continued)

OTHER PUBLICATIONS

U.S. Office Action mailed Feb. 24, 2006, from U.S. Appl. No. 11/077,108.

(Continued)

*Primary Examiner*—Caridad Everhart
(74) *Attorney, Agent, or Firm*—Beyer Weaver & Thomas LLP

(57) ABSTRACT

A densified dielectric film is formed on a substrate by a process that involves annealing a film deposited on the substrate by application of a localized energy pulse, such as a laser pulse, for example one of about 10 to 100 ns in duration from an excimer laser, that raises the temperature of the film above 1000° C. without raising the substrate temperature sufficiently to modify its properties (e.g., the substrate temperature remains below 550° C. or preferably in many applications below 400° C.). The dielectric deposition may be by any suitable process, for example CVD, SOG (spin-on glass), ALD, or catalyzed PDL. The resulting film is densified without detrimentally impacting underlying substrate layers. The invention enables dielectric gap fill and film densification at low temperature to the 45 nm technology node and beyond, while maintaining oxide film properties.

38 Claims, 7 Drawing Sheets

U.S. PATENT DOCUMENTS

| | | | |
|---|---|---|---|
| 6,335,261 B1 | 1/2002 | Natzle et al. | |
| 6,352,943 B1 | 3/2002 | Maeda et al. | |
| 6,352,953 B1 | 3/2002 | Seki et al. | |
| 6,372,669 B1 | 4/2002 | Sandhu et al. | |
| 6,503,330 B1 | 1/2003 | Sneh et al. | |
| 6,511,539 B1 | 1/2003 | Raaijmakers | |
| 6,531,377 B1 | 3/2003 | Knorr et al. | |
| 6,534,395 B1 | 3/2003 | Werkhoven et al. | |
| 6,534,802 B1 | 3/2003 | Schuegraf | |
| 6,540,838 B1 | 4/2003 | Sneh et al. | |
| 6,551,339 B1 | 4/2003 | Gavronsky | |
| 6,551,399 B1 | 4/2003 | Sneh et al. | |
| 6,586,349 B1 | 7/2003 | Jeon et al. | 438/758 |
| 6,780,789 B1 * | 8/2004 | Yu et al. | 438/764 |
| 6,802,944 B1 | 10/2004 | Ahmad et al. | |
| 6,861,334 B1 | 3/2005 | Raaijmakers et al. | |
| 6,867,152 B1 | 3/2005 | Hausmann et al. | |
| 6,908,862 B1 | 6/2005 | Li et al. | |
| 2001/0049205 A1 | 12/2001 | Sandhu et al. | |
| 2003/0015764 A1 | 1/2003 | Raaijmakers et al. | |
| 2003/0092241 A1 | 5/2003 | Doan et al. | |
| 2003/0129828 A1 | 7/2003 | Cohen et al. | |
| 2003/0157781 A1 | 8/2003 | Macneil et al. | |
| 2004/0004247 A1 | 1/2004 | Forbes et al. | |
| 2004/0043149 A1 | 3/2004 | Gordon et al. | |
| 2004/0044127 A1 | 3/2004 | Okubo et al. | |
| 2004/0079728 A1 | 4/2004 | Mungekar et al. | |
| 2004/0102031 A1 | 5/2004 | Kloster et al. | |
| 2004/0203254 A1 | 10/2004 | Conley et al. | 438/778 |
| 2004/0206267 A1 | 10/2004 | Sambasivan et al. | |
| 2005/0054213 A1 | 3/2005 | Derderian et al. | |
| 2005/0112282 A1 | 5/2005 | Gordon et al. | |
| 2005/0239264 A1 | 10/2005 | Jin et al. | |
| 2006/0038293 A1 | 2/2006 | Rueger et al. | 257/751 |

FOREIGN PATENT DOCUMENTS

| | | |
|---|---|---|
| JP | 2004-256479 | 9/2004 |
| WO | WO02/27063 | 4/2002 |
| WO | WO 03/083167 A1 | 9/2003 |

OTHER PUBLICATIONS

U.S. Office Action mailed Mar. 24, 2006, from U.S. Appl. No. 10/975,028.

"Atomic Layer Deposition of Metal Oxide Thin Films," A thesis presented by Dennis Michael Hausmann, Harvard University, 186 pages, Jul. 2002.

Hausmann et al., "Rapid Vapor Deposition of Highly Conformal Silica Nanolaminates," Science, vol. 308, Oct. 2002, 5 Pages.

Gordon et al., "A Kinetic Model for Step Coverage by Atomic Layer Deposition in Narrow Holes or Trenches", Chemical Vapor Deposition 2003, 9, No. 2, pp. 73-78.

U.S. Office Action mailed May 31, 2005, from U.S. Appl. No. 10/746,274.

Hausmann et al., "Plasma Treatments to Improve the Properties of Silica Thin Films Produced by a Rapid Vapor Deposition (RVD)", Novellus Systems, Inc., filed Dec. 23, 2000, U.S. Appl. No. 10/746,274, pp. 1-29.

Greer et al., "Method and Apparatus to Reduce the Frequency of Chamber Cleans in Rapid Vapor Deposition (RVD) of Silicon Oxide", Novellus Systems, Inc., filed Jul. 12, 2004, U.S. Appl. No. 10/890,376, pp. 1-25.

Hausmann et al., "Silica Thin Films Produced by Rapid Surface Catalyzed Vapor Deposition (RVD) Using a Nucleation Layer", Novellus Systems, Inc., filed Jun. 22, 2004, U.S. Appl. No. 10/875,158, pp. 1-25.

U.S. Office Action mailed Sep. 22, 2005, from U.S. Appl. No. 10/874,814.

Rulkens et al., "Mixed Alkoxy Precursors and Methods of Their Use for Rapid Vapor Deposition of $SiO_2$ Films", Novellus Systems, Inc., filed Jun. 22, 2004, U.S. Appl. No. 10/874,814, pp. 1-26.

U.S. Office Action mailed Jun. 23, 2005, from U.S. Appl. No. 10/874,808.

Hausmann et al., "Aluminum Phosphate Incorporation in Silica Thin Films Produced by Rapid Surface Catalyzed Vapor Deposition (RVD)", Novellus Systems, Inc., filed Jun. 22, 2004, U.S. Appl. No. 10/874,808, pp. 1-21.

Papsouliotis et al., "Method for Controlling Properties of Conformal Silica Nanolaminates Formed by Rapid Vapor Deposition", Novellus Systems, Inc., filed Jun. 22, 2004, U.S. Appl. No. 10/874,696, pp. 1-30.

Gaillard et al., "Silicon dioxide chemical vapor deposition using silane and hydrogen peroxide", Rapid Communications, J. Vac. Sci. Technol. B 14(4), Jul./Aug. 1996, pp. 2767-2769.

Beekmann, et al., "Properties of posttreated low κ flowfill™ films and their stability after etch, resist and polymer strip processes", Microelectronic Engineering 55(2001), pp. 73-79.

Robl et al., "Integration of Flowfill® and Forcefill® for cost effective via applications" Sep. 1999, pp. 77-83.

Penka et al., "Integration Aspects of Flowfill and Spin-on-Glass Process for Sub-0.35 μm Interconnects", pp. 1-3.

Hockele et al., "Flowfill-Process as a New Concept for Inter-Metal-Dielectrics", Siemens AG, Semiconductor Group, 1998, pp. 235-238.

Roland et al., "Theoretical Modeling of $SiO_2$ Photochemical Vapor Deposition and Comparison to Experimental Results for Three Oxidant Chemistries: $SiH_4+O_2$, $H_2O/O_2$, and $H_2O_2$", Chem Mater 2001, 13, 2501-2510.

Roland et al., "Low Temperature Photochemical Vapor Deposition of SiO2 Using 172 nm Xe2* Excimer Lamp Radiation with Three Oxidant Chemistries: $O_2$, $H_2O/O_2$, and $H_2O_2$", Chem Mater 2001, 13, 2493-2500.

Moore et al., "Reaction of hydrogen peroxide with organosilanes under chemical vapour deposition conditions", J. Chem. Soc., Dalton Trans., 2000, 2673-2677.

Gaillard et al., "Effect of plasma and thermal annealing on chemical vapor deposition dielectrics grown using $SIH_4$-$H_2O_2$ gas mixtures", J. Vac. Sci. Technol. A 15(5), Sep./Oct. 1997, pp. 2478-2484.

Taylor et al., "Studies on the reaction between silane and hydrogen peroxide vapour; surface formation of planarized silica layers", J. Chem. Soc., Dalton Trans., 1997, pp. 1049-1053.

Xia et al., "High Aspect Ratio Trench Filling Using Two-Step Subatmospheric Chemical Vapor Deposited Borophosphosilicated Glass for <0.18 μm Device Application", Journal of The Electrochemical Society, 146 (5) 1884-1888 (1999).

Xia et al., "High Temperature Subatmospheric Chemical Vapor Deposited Undoped Silicated Glass—A Solution for Next Generation Shallow Trench Isolation", Journal of The Electrochemical Society, 146 (3) 1181-1185 (1999).

Arno et al., "Fourier Transform Infrared Characterization of Downstream Gas-Phase Species Generated by Tetraethylorthosilicate/Ozone Atmospheric Pressure Reactions", Journal of The Electrochemical Society, 146 (1) 276-280 (1999).

Romet et al., "Modeling of Silicon Dioxide Chemical Vapor Deposition from Tetraethoxysilane and Ozone", Journal of The Electrochemical Society, 148 (2) G82-G90 (2001).

Ikeda et al., "The Effects of Alkoxy Functional Groups on Atomospheric-Pressure Chemical Vapor Deposition Using Alkoxysilane and Ozone", J. Electrochem. Soc., vol. 142, No. 5, May 1995, pp. 1659-1662.

"Customer A low k Gapfill Trikon FlowFill vs FHDP", Novellus Systems, Inc., pp. 1-12.

Ritala et al., "Atomic Layer Deposition", Handbook of Thin Films Materials, vol. 1, 2002, pp. 103-159.

Rulkens et al., "Methods for the Use of Alkoxysilanol Precursors for Vapor Deposition of $SiO_2$ Films", Novellus Systems, Inc., filed Dec. 23, 2004, U.S. Appl. No. 11/021,558, pp. 1-24.

Papasouliotis et al., "Dynamic Rapid Vapor Deposition Process for Conformal Silica Laminates", Novellus Systems, Inc., filed Dec. 30, 2004, U.S. Appl. No. 11/027,480, pp. 1-29.

Papasouliotis et al., "Multi-Step Nanolaminate Dielectric Deposition and Etch Back Gap Fill Process", Novellus Systems, Inc., filed Dec. 30, 2004, U.S. Appl. No. 11/026,563, pp. 1-28.

Rulkens et al., "Chamber and Chamber Surface Materials to Inhibit Deposition and Methods of Making Same", Novellus Systems, Inc., filed Dec. 23, 2004, U.S. Appl. No. 11/027,388, pp. 1-26.

Papasouliotis et al., "Methods for Forming High Density, Conformal, Silica Nanolaminate Films Via Pulsed Deposition Layer In Structures of Confined Geometry", Novellus Systems, Inc., filed Dec. 30, 2004, U.S. Appl. No. 11/026,284, pp. 1-24.

U.S. Office Action mailed Oct. 6, 2005, from U.S. Appl. No. 10/975,028.

Tarafdar et al., "Sequential Deposition/Anneal Film Densification Method", Novellus Systems, Inc., filed Oct. 26, 2004, U.S. Appl. No. 10/975,028, pp. 1-34.

Papasouliotis, George D., "Optimal Operation of Conformal Silica Deposition Reactors", Novellus Systems, Inc., U.S. Appl. No. 11/077,198, filed Mar. 9, 2005, pp. 1-32.

Papasouliotis, George D., "Optimal Operation of Conformal Silica Deposition Reactors", Novellus Systems, Inc., U.S. Appl. No. 11/077,108, filed Mar. 9, 2005, pp. 1-31.

Cho et al., "Hydroxyl Bond Removal and Film Densification Method for Oxide Films Using Microwave Post Treatment", Novellus Systems, Inc., U.S. Appl. No. 11/280,076, filed Nov. 15, 2005, pp. 1-27.

U.S. Office Action mailed Nov. 10, 2005, from U.S. Appl. No. 11/021,558.

U.S. Office Action mailed Dec. 30, 2005, from U.S. Appl. No. 11/026,284.

U.S. Office Action mailed Dec. 5, 2005, from U.S. Appl. No. 10/746,274.

U.S. Office Action mailed Dec. 7, 2005, from U.S. Appl. No. 10/874,808.

U.S. Office Action mailed Dec. 22, 2005, from U.S. Appl. No. 11/026,563.

Papasouliotis et al., "Metal-Free Catalysts for Pulsed Deposition Layer Process for Conformal Silica Laminates", Novellus Systems, Inc., U.S. Appl. No. 11/318,268, filed Dec. 23, 2005, pp. 1-30.

Papasouliotis et al., "Reactive Seam Healing Methods for Improving Film Integrity In Structures of Confined Geometry", Novellus Systems, Inc., U.S. Appl. No. 11/334,762, filed Jan. 17, 2006, pp. 1-24.

U.S. Office Action mailed May 23, 2006, from U.S. Appl. No. 11/077,198.

U.S. Office Action mailed May 24, 2006, from U.S. Appl. No. 11/026,284.

U.S. Office Action mailed May 31, 2006, from U.S. Appl. No. 11/026,563.

U.S. Office Action mailed May 15, 2006, from U.S. Appl. No. 11/027,480.

U.S. Office Action mailed Apr. 25, 2006, from U.S. Appl. No. 11/021,558.

* cited by examiner

LOCALIZED ENERGY PULSE RAPID THERMAL ANNEAL DIELECTRIC FILM DENSIFICATION METHOD

CROSS-REFERENCE TO RELATED APPLICATIONS

This application is a continuation-in-part of U.S. patent application Ser. No. 10/975,028 filed Oct. 26, 2004, titled SEQUENTIAL DEPOSITION/ANNEAL FILM DENSIFICATION METHOD, the disclosure of which is incorporated herein by reference in its entirety for all purposes.

BACKGROUND OF THE INVENTION

The present invention relates to the formation of dielectric films, in particular to the formation of dense dielectric films in high aspect ratio features on semiconductor substrates.

It is often necessary in semiconductor processing to fill a high aspect ratio gap with insulating material. One example of a high aspect ratio trench encountered in semi-conductor processing is in the formation of shallow trench isolation (STI). As device dimensions shrink and thermal budgets are reduced, void-free filling of high aspect ratio spaces (AR>3.0:1) becomes increasingly difficult due to limitations of existing deposition processes. The deposition of doped or undoped silicon dioxide assisted by high density plasma CVD, a directional (bottom-up) CVD process, is the method currently used for high aspect ratio (AR) gap-fill. Evolving semiconductor device designs and dramatically reduced feature sizes have resulted in several applications where HDP processes are challenged in filling the high aspect ratio structures (AR>7:1) using existing technology (see, for example, U.S. Pat. No. 6,030,881). For structures representative of the 65 nm and 45 nm technology nodes, engineering the gap-fill process becomes structure dependent, hence the process needs to be reoptimized, a task of considerable complexity, every time a new structure needs to be filled.

An alternative to CVD is atomic layer deposition (ALD). ALD methods involve self-limiting adsorption of reactant gases and can provide thin, conformal dielectric films within high aspect ratio features. The ALD process involves exposing a substrate to alternating doses of, usually two, reactant gasses. As an example, if reactants A and B are first and second reactant gases for an ALD process, after A is adsorbed onto the substrate surface to form a saturated layer, B is introduced and reacts only with adsorbed B. In this manner, a very thin and conformal film can be deposited. One drawback, however, to ALD is that the deposition rates are very low. Films produced by ALD are also very thin (i.e., about one monolayer); therefore, numerous ALD cycles must be repeated to adequately fill a gap feature. These processes are unacceptably slow in some applications in the manufacturing environment.

Another more recently developed technique useful in gap fill and other dielectric deposition applications in semiconductor processing is referred to as pulsed deposition layer (PDL) processing, sometimes also referred to as rapid surface-catalyzed vapor deposition (RVD). PDL is similar to ALD in that reactant gases are introduced alternately over the substrate surface, but in PLD the first reactant A acts as a catalyst, promoting the conversion of the second reactant B to a film. In ALD the reaction between A and B is approximately stoichiometric, meaning that a monolayer of A can only react with a similar amount of B before the film-forming reaction is complete. The catalytic nature of A in PDL allows a larger amount of B to be added, resulting in a thicker film. Thus, PDL methods allow for rapid film growth similar to using CVD methods but with the film conformality of ALD methods.

Deposited oxide films often require densification in order for their properties to match those of thermally generated silicon oxide (USG), which will allow its successful integration into functioning devices. Densification removes water from the deposited film. Moreover, the conformal nature of the process results in the formation of seams in filled trenches, which may allow attack by post gap fill wet etch (HF-based) in the seam. Etching in the seam can allow for polysilicon deposition in the seam during subsequent processing which would obviate its insulating effect. Therefore, a process sequence to anneal the film and substantially eliminate seams and voids is required.

Optimally, this process sequence can operate at under 550° C., in particular under 400° C., in order to be able to meet the thermal budget requirements of advanced devices (see A. R. Londergan, et. al., J. Electrochem. Soc., vol. 148, pp. C21–C27, January 2001). In pre-metal dielectric (PMD) applications, for example, where a layer of silica is applied over gates that have been previously built-up on a substrate, there is an inherent temperature limitation due to the material used to construct the gates, usually a metal silicide such as a nickel silicide. At temperatures above about 400° C., such as in the case of conventional thermal annealing (typically conducted at temperatures in excess of 700° C.) the gate silicide may become discontinuous, thereby increasing the resistance of the circuit and leading to performance problems. Further, there may be two or three PMD layers in a given device. Thus, it is desirable to implement a method to improve the material properties of the dielectric film and, for example, eliminate seams or voids in filled gaps, ideally maintaining temperatures that are low enough to avoid damaging underlying heat sensitive structures.

SUMMARY OF THE INVENTION

The present invention addresses this need by providing a method of forming a densified dielectric film on a substrate that involves annealing film deposited on the substrate by application of a localized energy pulse, such as a laser pulse, for example one of about 10 to 100 ns in duration from an excimer laser, that raises the temperature of the film above 1000° C. without raising the substrate temperature sufficiently to modify its properties (e.g., the substrate temperature remains below 550° C. or preferably in many applications below 400° C.). Such a localized energy pulse can raise the temperature the film sufficiently to melt the film and/or remove hydroxyl moieties from the film.

The dielectric deposition may be by any suitable process, for example CVD, SOG (spin-on glass), ALD, or catalyzed PDL. The dielectric may be any suitable silicon oxide-based material, doped or undoped, for example undoped silicon dioxide (undoped silica glass (USG)). Where the substrate is a partially fabricated semiconductor wafer comprising previously fabricated semiconductor devices, its preexisting films are not modified by the film annealing. Where the film is deposited in a gap at least a portion of the melted film can flow to fill a void or seam in the gap. The deposition may be conducted until the gap is filled, followed by the annealing operation. Or the successive alternating deposition and annealing operation may be conducted until the gap is filled.

The method of the invention can be used for forming a dielectric film for any purpose. In a specific embodiment, it is used for filling structures, such as gaps, in particular high aspect ratio trenches, on semiconductor substrates, e.g., IMD/ILD, PMD and STI applications.

The resulting film is densified without detrimentally impacting underlying layers. The invention enables dielectric gap fill and film densification at low temperature to the 45 nm technology node and beyond, while maintaining oxide film properties.

These and other aspects and advantages of the present invention are described below.

DETAILED DESCRIPTION OF SPECIFIC EMBODIMENTS

Figure 1:
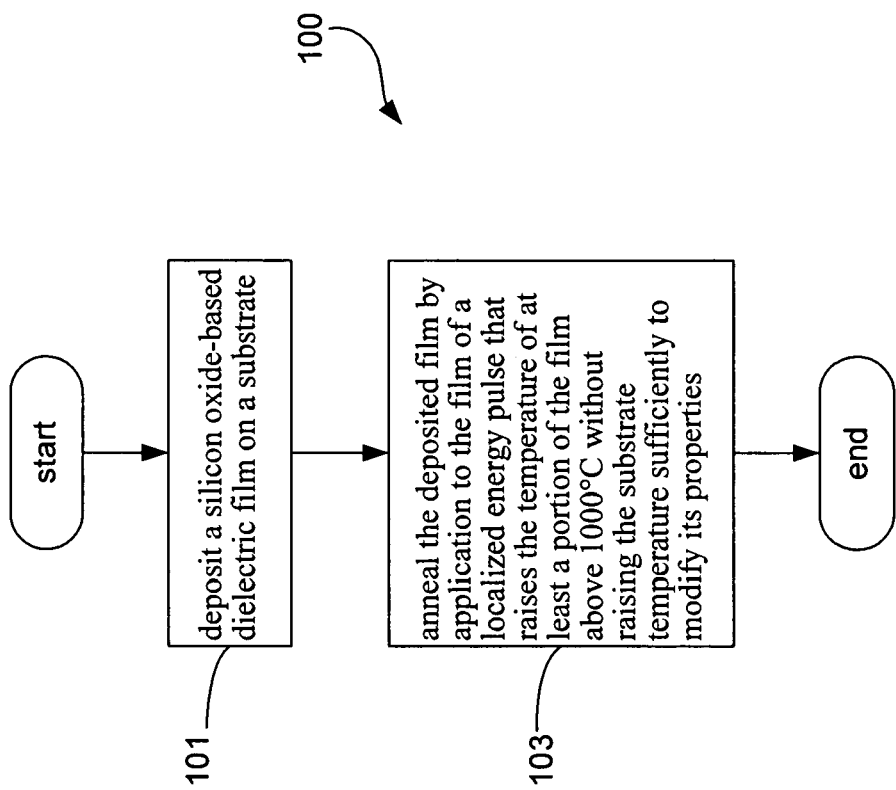
FIG. 1 is a process flow diagram illustrating operations of a process to form a densified dielectric film in accordance with the present invention.

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Introduction

Existing methods for densifying deposited silica films heat the entire substrate on which the film is deposited; therefore, in the case of a semiconductor substrate, they are limited by the thermal budget for the specific semiconductor device node. A post-deposition anneal process uses a localized energy pulse, that raises the temperature of at least a portion of the film above 1000° C. without raising the substrate temperature sufficiently to modify its properties. The pulse improves the electrical/optical properties of a deposited doped/undoped silica glass film. In gap fill applications, the conformal nature of the deposition processes such as PDL and ALD results in the formation of seams at the center of the trench, which need to be eliminated to ensure device performance. The method of the invention accomplishes seamless gap-fill by a rapid thermal anneal at a very low substrate temperature accomplished by a localized energy pulse, such as a laser pulse (e.g., a short (10 to 100 ns) pulse of an excimer laser), delivered to the deposited dielectric film surface. The pulse rapidly increases the temperature of the film causes near instant silica melting and therefore allows smooth dielectric fluid flow to ensure seamless gap fill in high aspect ratio gaps encountered in advanced technology nodes. It can be also used to eliminate seams and voids resulting from reentrant trench profiles. Due to the short duration of the energy (e.g., laser) pulse, the method does not raise the temperature of the substrate enough to impact the substrate's thermal budget.

General Process Parameters

Deposition

The dielectric deposition may be by any suitable thermal process, for example CVD or metal-catalyzed RVD. The dielectric may be any suitable silicon oxide-based material, doped or undoped, for example undoped silicon dioxide (undoped silica glass (USG)). In general, a layer thickness of about 300–15,000 Å or 500–1500 Å, for example about 1000 Å is suitable.

The formation of silica films by a pulsed layer deposition (PDL) can be catalyzed by metal containing or metal and metalloid-free compounds, such as acidic compounds. Specific examples are aluminum-containing catalyst precursors, for example, trimethylaluminum ($Al(CH_3)_3$), or phosphoric acid ($H_3PO_4$).

A pulsed layer deposition (PDL) process to form a conformal dielectric film begins with placement of a substrate into a deposition chamber. For many embodiments of the invention, the substrate is a semiconductor wafer. A "semiconductor wafer" as discussed in this document is a semiconductor substrate at any of the various states of manufacture/fabrication in the production of integrated circuits. As mentioned previously, one commercially important application of the present invention is in various dielectric gap-fill applications, such as filling of STI or PMD features. A catalyst or a catalyst precursor is supplied into the deposition chamber so as to substantially saturate the substrate surface. Any compound or precursor that can sufficiently adsorb onto or react with the substrate surface and prepare it to sufficiently further react with the subsequently added silicon-containing precursor may be used. In addition, the catalyst or precursor should be capable of aiding the catalytic polymerization of the subsequently added silicon-containing precursor to produce a film thicker than a monolayer.

Metal-containing compounds suitable as catalyst precursors in a PDL process include aluminum-containing compounds, for example, hexakis(dimethylamino) aluminum ($Al_2(N(CH_3)_2)_6$) or trimethylaluminum ($Al(CH_3)_3$). Other suitable aluminum-containing precursors include, for example, triethylaluminum ($Al(CH_2CH_3)_3$) or aluminum trichloride ($AlCl_3$). Other metal-containing precursors that can be deposited to reactivate the catalytic surface include, but are not limited to, zirconium, hafnium, gallium, titanium, niobium, tantalum, and their oxides or nitrides.

Metal- and metalloid-free compounds suitable as catalysts in a PDL process include organic acids (e.g., acetic acid), anhydrides of organic acids, dialkylphosphates, alkysphosphates, phosphonic acids, phosphinic acids, phosphorus oxides, alkylamines (primary, secondary or tertiary), arylamines, alky/arylboronic acids, sulphonic acids, water, ammonium salts, phosphonitrile compounds, boron triflates, inorganic acids (e.g., phosphoric acid), anhydrides of inorganic acids, and combinations thereof.

Forming a catalyst-activated layer is a self-limiting process. Relevant process conditions can include substrate (e.g., wafer) temperature, reactor pressure, reactant partial pressure, and combinations thereof, and can very widely depending upon the particular calatyst or precursor used. For a metal containing catalyst precursor, pressures can range broadly, e.g., between about 1 mTorr and 760 Torr. Typical pressures range between about 100 and 750 mTorr and typical temperatures range between about 250 and 300 degrees Celsius. Flow rates of aluminum-containing precursor gas can range broadly, e.g., between about 1 and 10000 sccm. Preferred flow rates of aluminum-containing precursor gas range between about 100 and 400 sccm. The dose of aluminum-containing precursor can range broadly, e.g., between about 0.001 milligrams and 10 grams. Typical aluminum-containing precursor doses range between about 0.01 and 0.02 grams. Exposure times suitable for forming a saturated layer are typically only seconds. In some embodiments, for example, an exposure time of about 1 to 2 seconds is found to be sufficient.

For a metal- and metalloid-free catalyst, pressures can range broadly, e.g., between about 1 mTorr and 760 Torr. Typical pressures range between about 500 and 1250 mTorr and typical temperatures range between about 0 and 300° C., for example between about 20 and 250° C., such as 20, 50, 100, 200, 230 or 250° C. in various implementations. Flow rates of catalyst reactants can range broadly, e.g., between about 1 and 10000 sccm in the gas phase. Preferred gas phase flow rates of the catalyst range between about 1 and 100 sccm. Catalysts may also alternatively be delivered to the reactor and/or the substrate surface in the liquid phase. Suitable liquid phase delivery flow rates can be between 0.01 and 100 mL/min; or the liquid catalysts can be delivered to the substrate surface by dipping, painting, spraying, etc. Suitable liquid phase catalyst concentrations can vary widely, for example from about $10^{-3}$ to 12M, such as about 0.01, 0.1, 1, 2, 5, 7 or 10M. Exposure times suitable for forming a saturated layer are typically only seconds, e.g., about 1 to 10 seconds. In some embodiments, for example, an exposure time of about 2 seconds or 5 seconds is found to be sufficient. Given the directions and parameters provided herein, one of skill in the art will be able to readily determine the appropriate conditions for effective use of a given catalyst in accordance with the present invention.

After the catalyst layer is formed an inert gas is preferably used to purge the substrate surface and reaction chamber (not shown). It should be noted that introduction of a purge gas can be used in between operations wherein contact between reactant gases should be avoided, including between each process cycle. Further, the purge gas can be flowed continuously during any of these operations and a period or periods between the operations. Purge gases are generally inert. Examples include the noble gases (e.g., argon) and nitrogen. The reaction chamber may additionally be evacuated following inert gas purge.

Following the chamber purge, the catalyst-activated substrate surface is exposed to a silicon-containing precursor gas under conditions selected for growth of a conformal dielectric film. Any suitable silicon-containing precursor that can sufficiently adsorb onto and react with the catalytic layer to form a dielectric film may be used. In addition, the silicon-containing precursor should be capable of polymerization when exposed to the adsorbed catalyst to produce a film thicker than a monolayer. Preferred silicon-containing precursors include silanols and silanediols, such as alkoxysilanols, alkyl alkoxysilanols, alkyl alkoxysilanediols and alkoxysilanediols. Examples of suitable precursors include tris(tert-butoxy)silanol (($C_4H_9O)_3SiOH$), tris(tert-pentoxy) silanol(($C_5H_{11}O)_3SiOH$), di(tert-butoxy)silandiol (($C_4H_9O)_2Si(OH)_2$) and methyl di(tert-pentoxy)silanol.

Process parameters during exposure to the silicon-containing precursor including temperature, gas pressure, flow rate, dose and exposure times will vary depending on the types of precursors used, reaction chamber configuration and desired final film thickness, deposition rate and dielectric characteristics, among other variables. As noted, the process conditions in accordance with the present invention are dynamic, at first selected to optimize surface smoothness, then selected to optimize conformality and deposition rate. Generally, temperatures can range from about 150 to 300° C. A typical initial deposition temperature is about 200° C.; and 230° C. for subsequent deposition stages. Pressures can range broadly, e.g., between about 1 mTorr and 760 Torr. Typical pressures range between about 500 mTorr and 20 Torr. Flow rates of silicon-containing precursor gas can range broadly, e.g., between about 1 and 10000 sccm. Preferred flow rates of silicon-containing precursor gas range between about 200 and 1000 sccm. Exposure times can range broadly, e.g., between about 1 milliseconds and 200 seconds. Preferred exposure times typically range between about 10 and 60 seconds. The number of separate exposures to silicon-containing precursor will primarily depend upon the desired final film thickness. Typical numbers of silicon-containing precursor exposure cycles for a STI feature 0.1 micron in diameter range between about 2 and 4. Again, as with the temperature process condition, these other process conditions may be modulated alone or in combinations in the dynamic process of the invention in accordance with the parameters noted above.

While the invention is not limited to this theory of operation, as mentioned previously, it is believed that the catalyst is adsorbed onto or reacts with the substrate surface, and the accumulation of dielectric film is achieved via a polymerization process. The activated substrate surface layer can catalytically polymerize the silicon-containing precursor to produce growing chains of silica. After a period of growth determined by the substrate temperature, the silica polymer can "gel" or "cross-link" to form a solid silicon oxide.

The catalyst and silicon-containing precursor exposures may be repeated a number of times, for example a total of 2–5 times, to build up a silica nanolaminate structure forming the completed dielectric film. For example, the operations might be repeated until a dielectric layer of a desired thickness is obtained and/or a gap is filled by the deposited dielectric.

Localized Energy Pulse Annealing

A post-deposition anneal process uses a localized energy pulse, that raises the temperature of the affected portion of a deposited dielectric film above 1000° C. without raising the temperature of the substrate on which the film is deposited sufficiently to modify its properties. In particular, the substrate temperature is generally maintained below 550° C., and in many applications, such as where the substrate includes a Ni silicide layer, below 400° C. In some applications the substrate temperature remains below 200° C. In this way, the pulse improves the electrical and/or optical properties of a deposited doped or undoped silica glass film without damaging underlying heat sensitive structures in the underlying substrate (i.e., without violating the substrate's thermal budget requirements). The invention may be implemented with a laser pulse; a short (e.g., 10 to 100 ns) pulse of a laser, such as an excimer laser operating at a wavelength of about 193 nm, for example delivered to the deposited dielectric film surface. Other types of lasers (e.g., solid state laser, gas laser, gas-ion laser, semiconductor laser, etc.) can be used for this application. A wide range of laser wavelengths (preferentially, lasers of wavelength between 150 nm and 1.54 μm) can be used depending on the properties of the film (for example, its chemical composition).

In gap fill applications, the conformal nature of the deposition processes such as PDL and ALD results in the formation of seams at the center of the trench, which need to be eliminated to ensure device performance. A localized energy pulse, such as a laser pulse (e.g., a short (10 to 100 ns) pulse of a 193 nm excimer laser), delivered to the deposited dielectric film surface causes near instant silica melting and therefore allows smooth dielectric fluid flow to ensure seamless gap fill in high aspect ratio gaps encountered in advanced technology nodes. This rapid thermal annealing post treatment is an effectively zero thermal budget process since heating and cooling of the wafer surface occurs within milliseconds. The method can be applied to IMD/ILD, PMD, and STI, doped or undoped silica glass.

FIG. 1 illustrates a process flow showing important operations in a method of forming a densified dielectric film in accordance with the present invention. The method 100 involves depositing a silicon oxide-based dielectric film on a substrate by a technique such as PDL or ALD (101); and annealing the deposited film by application to the film of a localized energy pulse that raises the temperature of at least a portion of the film above 1000° C. without raising the substrate temperature sufficiently to modify its properties (103). In a specific embodiment, the localized energy pulse is provided by a laser pulse adequate for melting the silicon oxide-based dielectric (silica).

Figure 2:
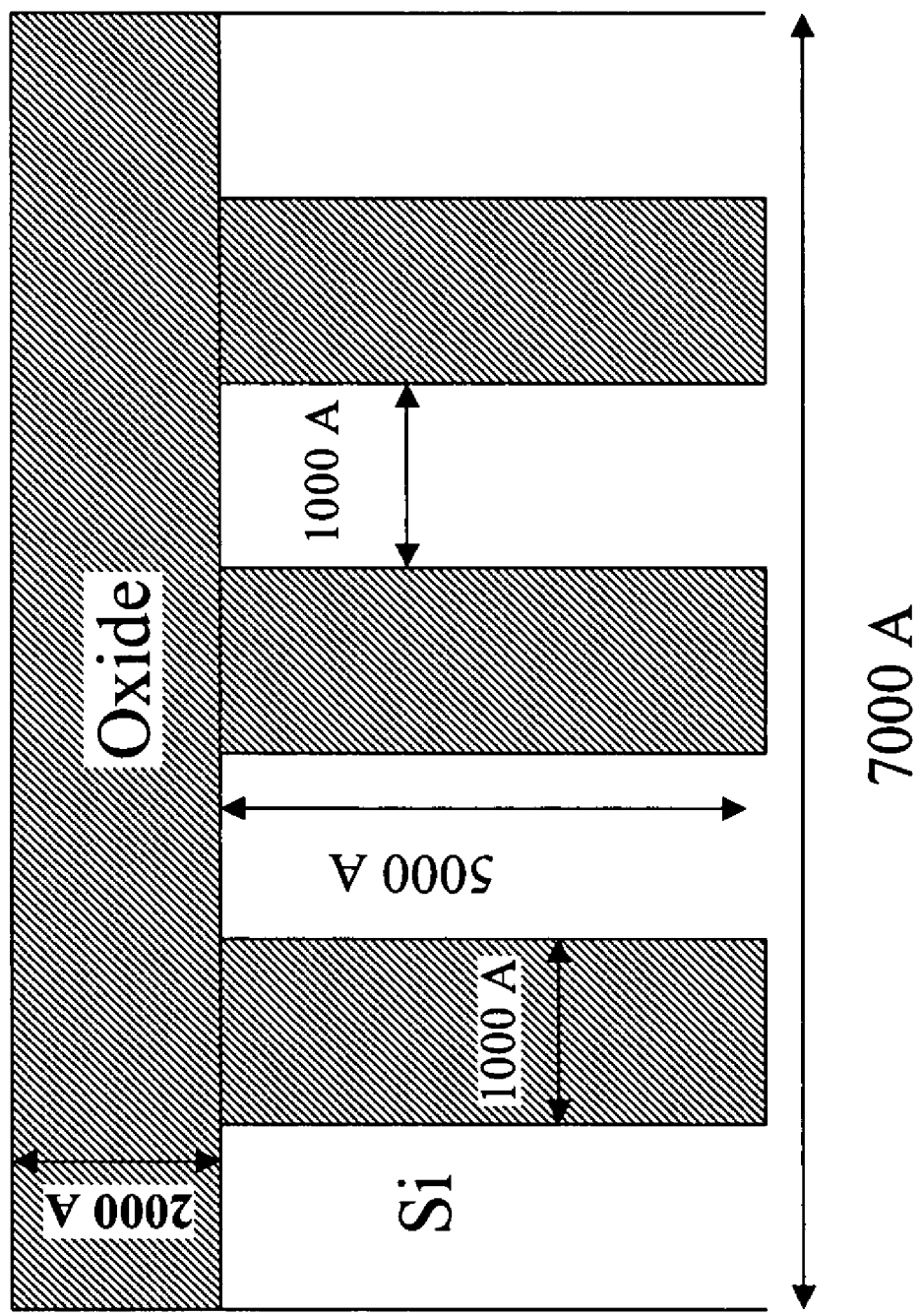
FIG. 2 illustrates sample trench geometry used for energy calculations for a post-deposition laser pulse anneal in accordance with the present invention.

One valuable application of the present invention is in semiconductor wafer gap fill. Calculations, noted below, for a typical trench of 5:1 aspect ratio (5000 Å deep by 1000 Å wide and spaced), illustrated in FIG. 2, show that the amount of energy per unit area needed to melt the silica on the substrate is 0.013 $J/cm^2$:

Assume the structures of FIG. 2, and a 3rd dimension (1000 Å) perpendicular to the image plane. ΔHfusion=8.514 kJ/mol, Chemical Properties Handbook, C. L. Yang, Editor, McGraw-Hill, 1999.

The total volume of $SiO^2$ per unit area of die is:
{[2000×7000×1E-16 $cm^2$+3×5000×1000×1E-16 $cm^2$]× 1000×1E-8 cm}/7000×1000×1E-16 $cm^2$=4.143 E-5 $cm^3/cm^2$ The total moles of $SiO_2$ per unit area are:
4.143 $cm \times 2.2$ $gr/cm^3$ :1 gmole/60 gr=0.152 E-5 gmole/$cm^2$ 2.2 $gr/cm^3$: density of $SiO_2$, 60=MW Total energy required to melt the above amount of $SiO_2$=0.152 E-5×8.514E3=0.0129 $J/cm^2$ A typical excimer laser, such as described in L. Herbst, et al., SPIE USE, v. 2, 5004-10, 2002, can supply up 300 W of power at a frequency of 300 Hz with a beam size of 38×13 mm and a 193 nm wavelength. The energy density is therefore 0.2 J/cm2 at 300 Hz frequency, and thus sufficient for melting and flowing the silica film. Operation (101) may be conducted until the gap is filled; followed by operation (103). Alternatively, operations (101) and (103) may be repeated a sufficient number of times to fill the gap.

Since the energy pulses are short and the beam is localized, the temperature increase is essentially limited to the deposited film; the temperature of the substrate does not rise to a level that would impact its thermal budget. Because of the precise local exposure to the laser pulse, the laser power, frequency, beam size, and intensity can be adjusted depending of the application and the feature size of device. Also, the anneal can be done on a die-by-die basis in a step and repeat laser process. The laser beam is applied in a limited area on the dielectric film deposited on the substrate that can be on the order of one die.

Other Embodiments

This method applies to the deposition and annealing of silica (USG). However, this method may also be used for depositing doped silica films, such as fluorine-doped silicate glass (FSG), phosphosilicate glass (PSG), boro-phosphosilicate glass (BPSG), or carbon doped low-k materials. It pertains to IMD/ILD, STI and PMD applications.

Apparatus

The deposition and post-deposition annealing treatment steps can be carried out in situ in the same chamber, in an integrated mode (tool), or in separate chambers (with vacuum break). Some sample apparatus for implementing the invention are described below. While the apparatus described below relate to PDL and laser pulse annealing, it should be understood that these are just examples of deposition and annealing techniques suitable for implementation of the present invention. Several other deposition and anneal techniques, and associated apparatus, examples of which are known in the art, may alternatively be used.

Deposition Apparatus

Figure 3:
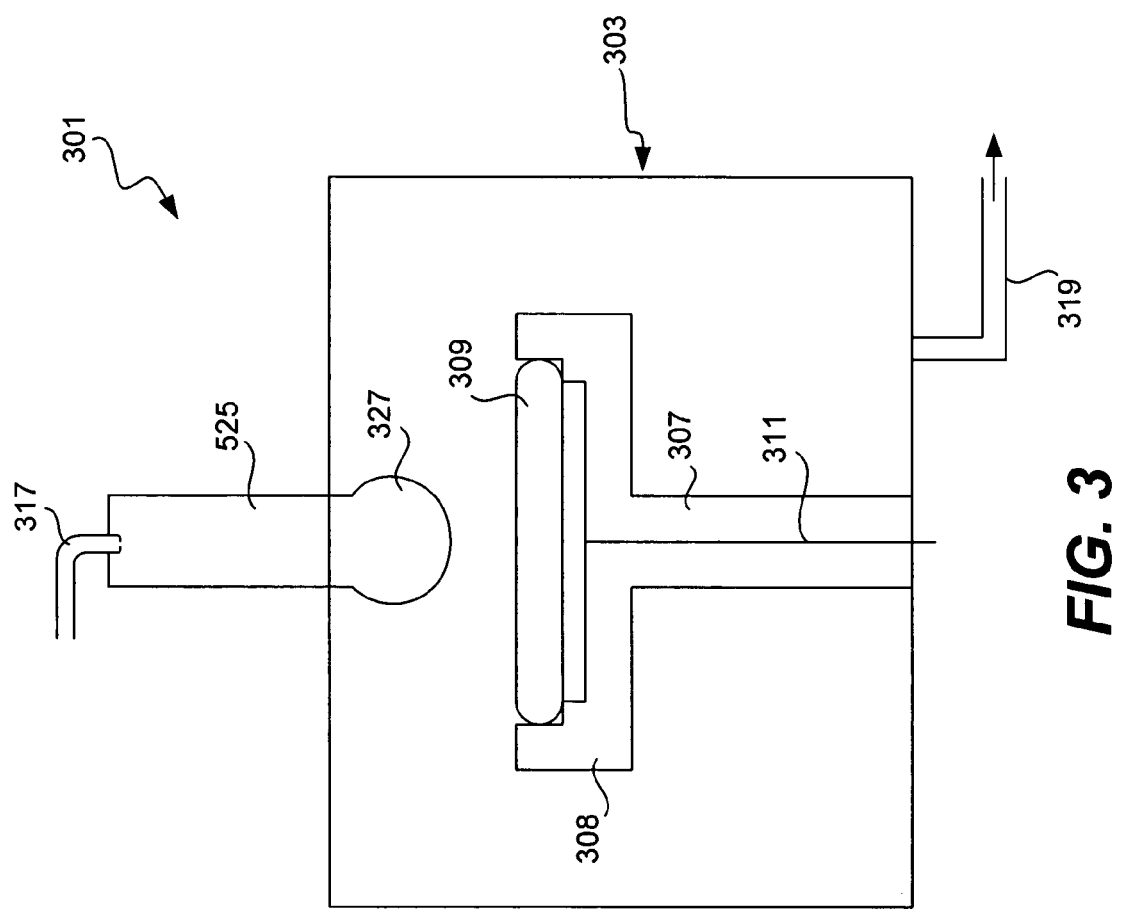
FIG. 3 is a schematic diagram showing the basic features of a PDL reactor module suitable for depositing silicon-based dielectric for localized energy pulse annealing in accordance with the present invention.

FIG. 3 is a block diagram depicting some components of a suitable reactor for performing dielectric deposition using a PDL process in accordance with one embodiment of this invention. Note that this apparatus is only an example of suitable apparatus for deposition in accordance with this embodiment of the present invention. Many other apparatuses and systems, including a multi-chambered apparatus, may be used.

As shown, a reactor 301 includes a process chamber 303, which encloses components of the reactor and serves to contain the reactant gases and provide and area to introduce the reactant gases to substrate 309. The chamber walls may be made of or plated with any suitable material, generally a metal that is compatible with the deposition and associated processes conducted therein. In one example, the process chamber walls are made from aluminum. Within the process chamber, a wafer pedestal 307 supports a substrate 309. The pedestal 307 typically includes a chuck 308 to hold the substrate in place during the deposition reaction. The chuck 308 may be an electrostatic chuck, a mechanical chuck or various other types of chuck as are available for use in the industry and/or research.

A heat transfer subsystem including resistive heaters and/or lines 311 for supplying a heat transfer fluid to the pedestal 307 controls the temperature of pedestal 307. In some embodiments, the heat transfer fluid comprises water or another liquid. The reactant gases, as well as inert gases during purge, are introduced individually into the reactor via inlet 317. A showerhead 327 may be used to distribute the gas flow uniformly in the process reactor. Reactant gases are introduced through a gas supply inlet mechanism including orifices. There may be multiple reactant gas tubes and inlets. A vacuum pump connected to outlet 319 can draw out gases between PDL cycles.

Anneal Apparatus

Figure 4:
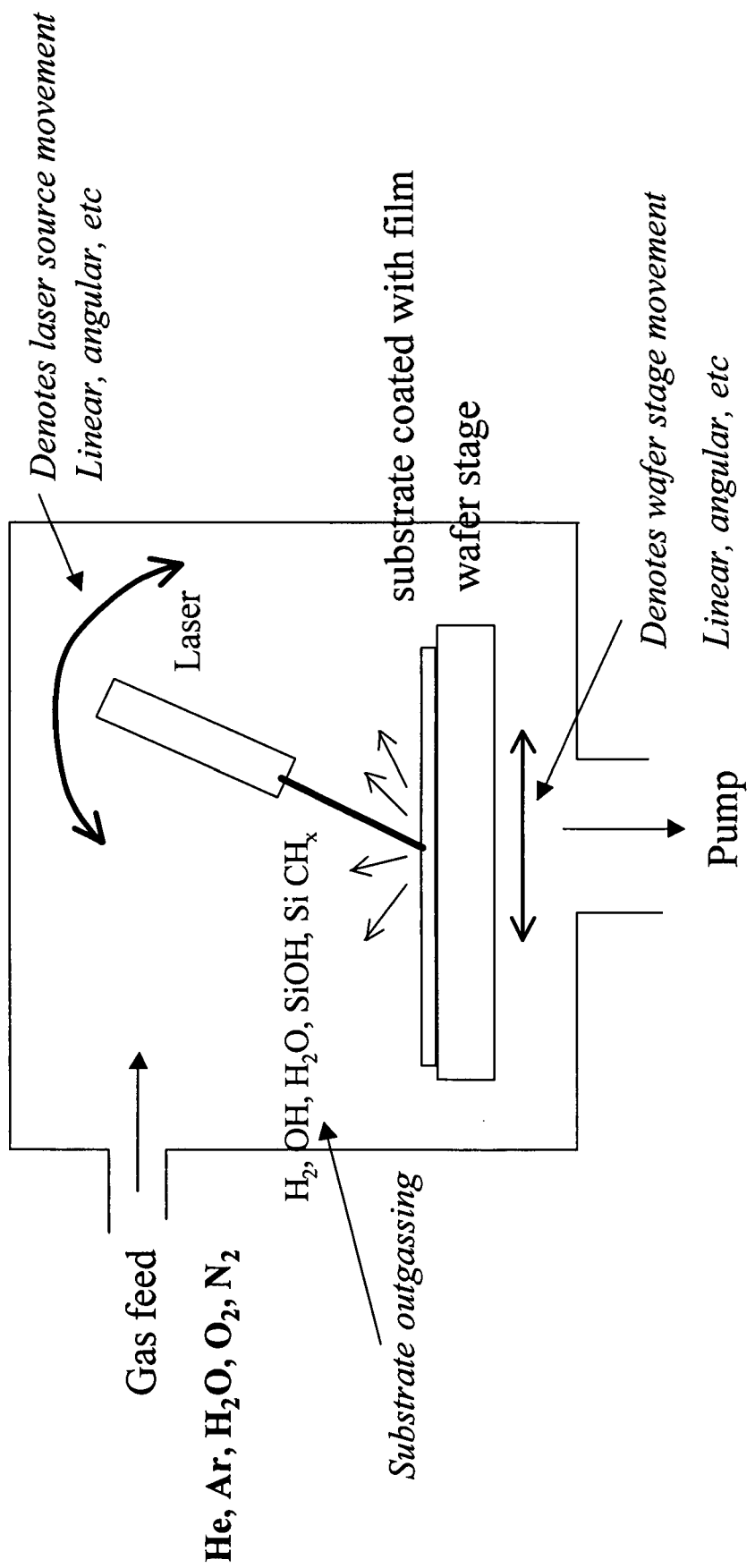
FIG. 4 is a schematic diagram showing the basic features of a laser pulse annealing system suitable for localized energy pulse annealing of a deposited silicon film in accordance with the present invention.

In accordance with one embodiment of the present invention, post-deposition annealing may be conducted using a laser-based process. FIG. 4 is a block diagram depicting some components of a suitable laser pulse annealing reactor for performing laser pulse annealing in accordance with one embodiment of this invention. Note that this apparatus is only an example of suitable apparatus for annealing in accordance with this embodiment of the present invention. Many other apparatuses and systems, including a multi-chambered apparatus, may be used.

The principal components of most suitable reactors include a laser source, substrate stage, pumps and a gas supply system. The laser can be mounted at the top of the chamber and can move in a linear and/or angular fashion so that it can scan the whole wafer. Various laser scanning methods can be implemented (e.g., linear scan, point-by-point scan, etc). The substrate stage could be heated for some applications and can be moved in a linear and/or angular fashion to facilitate laser scan. Various chamber pressures (e.g., 1 mT to 760 T) and different gases (e.g., He, Ar, $H_2$, $O_2$, $N_2$, air, etc.) can be applied to optimize process performance in various applications.

Various details of the apparatuses have been omitted for clarity's sake, and various design alternatives may be implemented.

EXAMPLE

The following example provides details relating to performance advantages of the present invention. It should be understood the following is representative only, and that the invention is not limited by the detail set forth in this example.

Figure 5A:
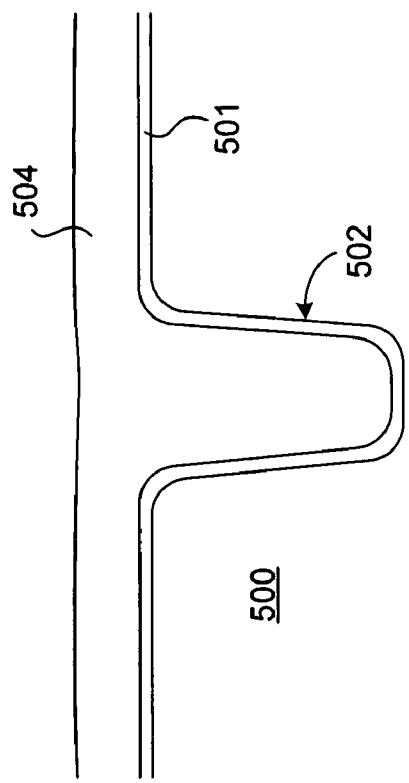
FIG. 5A shows a sample trench post-deposition but pre-annealing in accordance with the present invention.
Figure 5B:
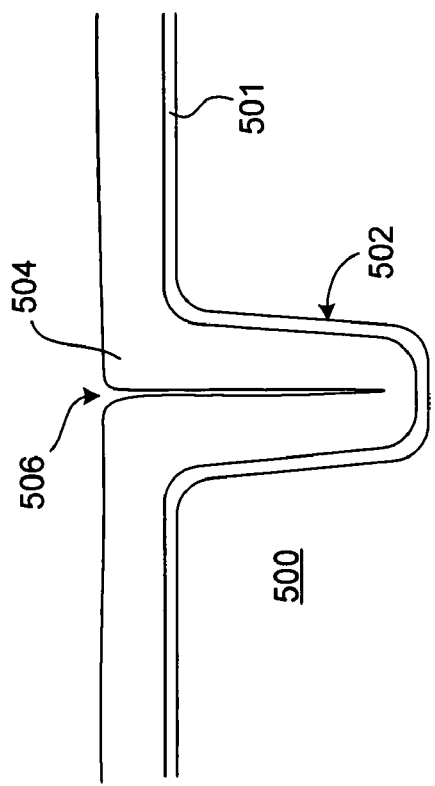
FIG. 5B shows the sample trench of FIG. 5A post-laser pulse annealing.

Referring to FIGS. 5A–B, STI trenches 502 in a Si-based semiconductor substrate 500 were filled by depositing a silicon-oxide film 504 with a PDL process using trimethylaluminum ($Al(CH_3)_3$) as a metal catalyst-containing precursor and tris(tert-pentoxy)silanol (($C_5H_{11}O)_3SiOH$) as the silicon containing precursor. Following completion of the deposition, a seam 506 remained between opposing faces of the dielectric film 504 deposited in the trenches 502, as illustrated in FIG. 5A which shows a sample trench post-deposition but pre-annealing. Annealing was conducted by a laser pulse annealing technique in accordance with the present invention in which an excimer laser operating at a wavelength of about 193 nm was pulsed on the film 504 in each trench 502 for about 50 ns at a pressure of 1 Atm (760 Torr), at room temperature in air. The resulting structure is illustrated in FIG. 5B which shows the sample trench of FIG. 5A post-annealing. The oxide 504 in the trenches has melted, eliminating the seams, while the underlying Si-based substrate 500 and the SiN trench liner 501 remain intact and unchanged.

Figure 6:
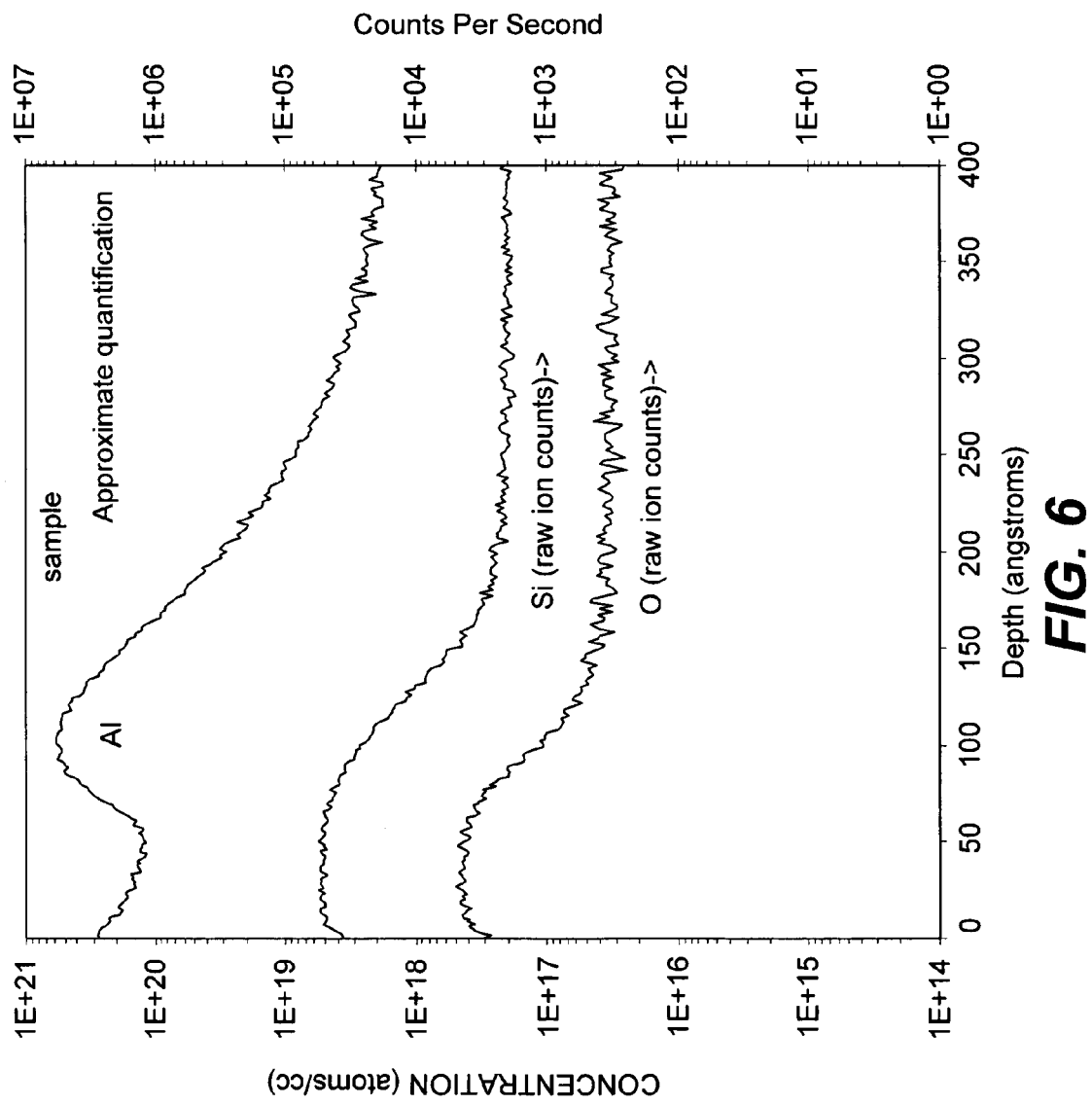
FIG. 6 depicts the secondary ion mass spectrometry (SIMS) profile of the laser annealed film of FIG. 5B showing evidence of film melting.

FIG. 6 depicts the secondary ion mass spectrometry (SIMS) profile of the laser annealed film showing evidence of film melting. The discreet $Al_2O_3$ interfaces that are characteristic of PDL films deposited using the above chemistry are not visible in the SIMS trace. Moreover, the interfaces were not visible in SEM images of the annealed films after decoration.

Figure 7:
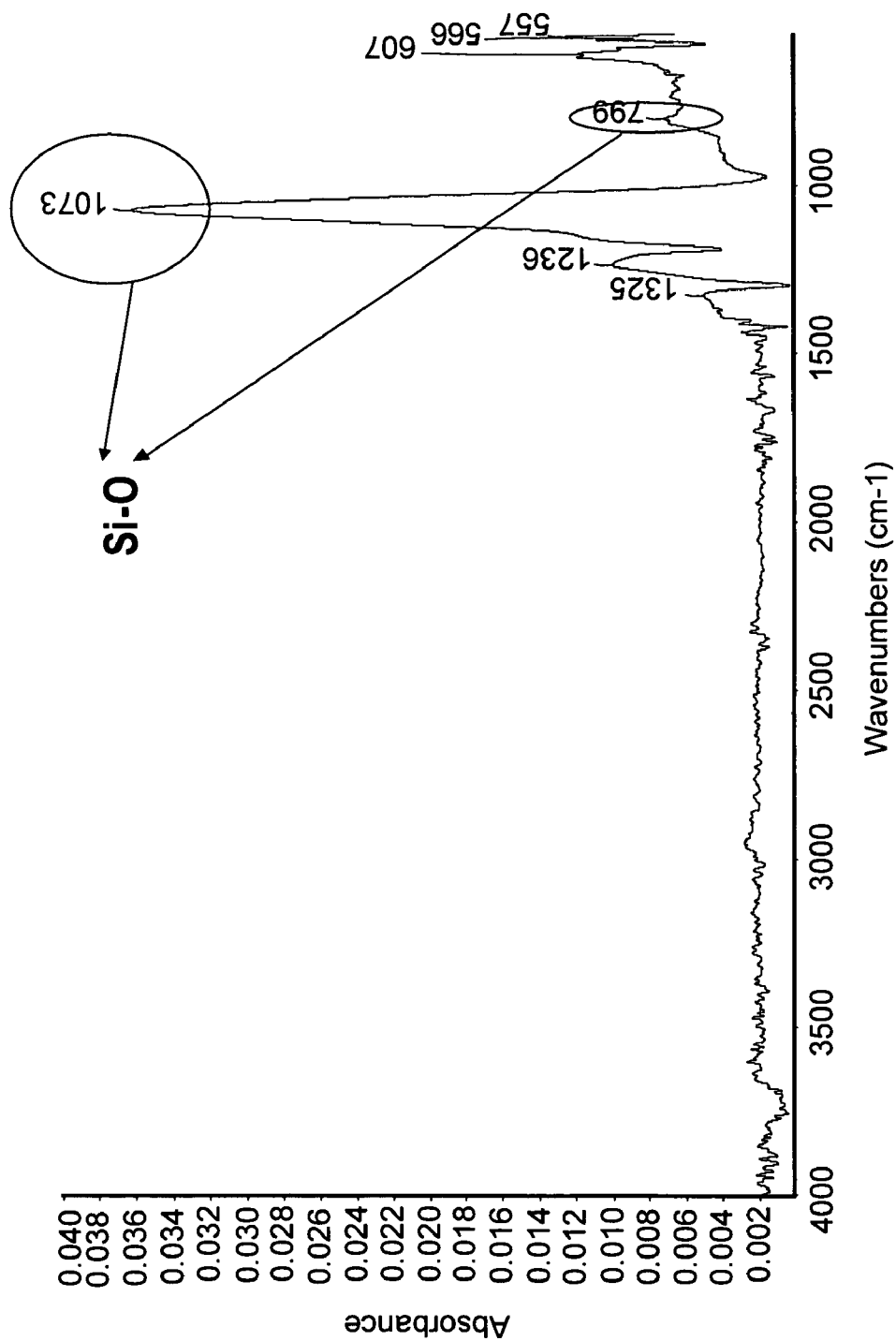
FIG. 7 shows the FTIR spectra of the laser annealed film of FIG. 5B showing the absence of hydroxyl groups.

FIG. 7 shows the FTIR spectra of the annealed film. The post anneal spectra do not contain SiOH peaks (at around 3500 $cm^{-1}$), which indicates the absence of hydroxyl (—OH) groups following annealing.

Accordingly, the results indicate that the laser pulse annealing technique has closed the seams to complete the gap fill and eliminated hydroxyl groups from the film without damaging the underlying substrate.

CONCLUSION

Although the foregoing invention has been described in some detail for purposes of clarity of understanding, it will be apparent that certain changes and modifications may be practiced within the scope of the appended claims. It should be noted that there are many alternative ways of implementing both the process and compositions of the present invention. For example, while the invention has been described primarily with reference to a PDL/laser pulse anneal embodiment herein, other deposition and anneal techniques can also be used in accordance with the invention. Also, while the invention has been described primarily in terms of preparing integrated circuits, it is not so limited. Accordingly, the present embodiments are to be considered as illustrative and not restrictive, and the invention is not to be limited to the details given herein, but may be modified within the scope and equivalents of the appended claims.

The entire disclosures of all references cited herein are incorporated by reference for all purposes.

The invention claimed is:

1. A method of forming a densified dielectric film, the method comprising:
   (a) depositing a silicon oxide-based dielectric film in a gap on a substrate; and
   (b) annealing the deposited film by application to the film of a localized energy pulse that raises the temperature of at least a portion of the film above 1000° C. without raising the substrate temperature sufficiently to modify its properties.

2. The method of claim 1, wherein the localized energy pulse raises the temperature of the at least a portion of the film sufficiently to remove hydroxyl moieties from the film.

3. The method of claim 1, wherein the substrate temperature remains below 550° C.

4. The method of claim 1, wherein the substrate temperature remains below 400° C.

5. The method of claim 1, wherein the substrate temperature remains below 200° C.

6. The method of claim 1, wherein the substrate is a partially fabricated semiconductor wafer comprising previously fabricated semiconductor devices.

7. The method of claim 1, wherein the substrate comprises existing films that are not modified by the film annealing.

8. The method of claim 1, wherein the localized energy pulse delivers an energy per unit area of at least 0.013 $J/cm^2$.

9. The method of claim 1, wherein operation (a) is conducted until the gap is filled; followed by operation (b).

10. The method of claim 1, wherein operations (a) and (b) are repeated a sufficient number of times to fill the gap.

11. The method of claim 1, wherein the film layer thickness is between 300 and 15,000 Å.

12. The method of claim 1, wherein the film layer thickness is about 1000 Å.

13. The method of claim 1, wherein the localized energy pulse raises the temperature of the at least a portion of the film sufficiently to melt the at least a portion of the film.

14. The method of claim 13, wherein at least a portion of the melted film flows to fill a void or seam in the gap.

15. The method of claim 1, wherein the localized energy pulse is laser pulse.

16. The method of claim 15, wherein the laser pulse is delivered by an excimer laser.

17. The method of claim 16, wherein laser pulse has a duration of about 10 to 100 ns to the surface of the deposited dielectric film.

18. The method of claim 1, wherein (a) comprises:
(i) exposing the substrate surface to a catalyst or catalyst-containing precursor gas to form a catalyst or a catalyst-containing precursor on the substrate surface; and
(ii) exposing the substrate surface to a silicon-containing precursor gas to form a silicon oxide-based dielectric film layer on the substrate.

19. The method of claim 18, wherein the catalyst or catalyst-containing precursor is a metal catalyst-containing precursor is selected from the list of metal catalyst-containing precursors comprising aluminum, zirconium, hafnium, gallium, titanium, niobium, and tantalum.

20. The method of claim 19, wherein the metal catalyst-containing precursor is at least one of hexakis(dimethylamino) aluminum and trimethyl aluminum.

21. The method of claim 18, wherein the catalyst or catalyst-containing precursor is a metal- and metalloid-free catalyst that can sufficiently adsorb onto or react with the substrate surface and prepare it to react with the subsequently added silicon-containing precursor to form a dielectric layer more than a monolayer thick.

22. The method of claim 21, wherein the catalyst is selected from the group consisting of organic acids, anhydrides of organic acids, dialkylphosphates, alkylphosphates, phosphonic acids, phosphinic acids, phosphorus oxides, alkylamines (primary, secondary or tertiary), arylamines, alkyl/arylboronic acids, sulphonic acids, water, ammonium salts, phosphonitrile compounds, boron triflates, inorganic acids, anhydrides of inorganic acids, and combinations thereof.

23. The method of claim 18, wherein the silicon-containing precursor is at least one of a silanol and a silanediol.

24. A method of forming a densified dielectric film, the method comprising:
(a) depositing a silicon oxide-based dielectric film on a substrate; and
(b) annealing the deposited film by application to the film of a localized energy pulse that raises the temperature of at least a portion of the film above 1000° C. without raising the substrate temperature sufficiently to modify its properties,
wherein (a) comprises:
(i) exposing the substrate surface to a catalyst or catalyst-containing precursor gas to form a catalyst or a catalyst-containing precursor on the substrate surface; and
(ii) exposing the substrate surface to a silicon-containing precursor gas to form a silicon oxide-based dielectric film layer on the substrate.

25. The method of claim 24, wherein the silicon-containing precursor is at least one of a silanol and a silanediol.

26. The method of claim 24, wherein the film layer thickness is between 300 and 15,000 Å.

27. The method of claim 24, wherein the film layer thickness is about 1000 Å.

28. The method of claim 24, wherein the localized energy pulse raises the temperature of the at least a portion of the film sufficiently to remove hydroxyl moieties from the film.

29. The method of claim 24, wherein the substrate temperature remains below 550° C.

30. The method of claim 24, wherein the substrate comprises existing films that are not modified by the film annealing.

31. The method of claim 24, wherein the localized energy pulse delivers an energy per unit area of at least 0.013 J/cm$^2$.

32. The method of claim 24, wherein the catalyst or catalyst-containing precursor is a metal catalyst-containing precursor selected from the list of metal catalyst-containing precursors comprising aluminum, zirconium, hafnium, gallium, titanium, niobium, and tantalum.

33. The method of claim 32, wherein the metal catalyst-containing precursor is at least one of hexakis(dimethylamino) aluminum and trimethyl aluminum.

34. The method of claim 24, wherein the catalyst or catalyst-containing precursor is a metal- and metalloid-free catalyst that can sufficiently adsorb onto or react with the substrate surface and prepare it to react with the subsequently added silicon-containing precursor to form a dielectric layer more than a monolayer thick.

35. The method of claim 34, wherein the catalyst is selected from the group consisting of organic acids, anhydrides of organic acids, dialkylphosphates, alkylphosphates, phosphonic acids, phosphinic acids, phosphorus oxides, alkylamines (primary, secondary or tertiary), arylamines, alkyl/arylboronic acids, sulphonic acids, water, ammonium salts, phosphonitrile compounds, boron triflates, inorganic acids, anhydrides of inorganic acids, and combinations thereof.

36. The method of claim 24, wherein the localized energy pulse is laser pulse.

37. The method of claim 36, wherein the laser pulse is delivered by an excimer laser.

38. The method of claim 37, wherein laser pulse has a duration of about 10 to 100 ns to the surface of the deposited dielectric film.

\* \* \* \* \*